United States Patent [19]

May et al.

[11] Patent Number: 6,030,875

[45] Date of Patent: Feb. 29, 2000

[54] METHOD FOR MAKING SEMICONDUCTOR DEVICE HAVING NITROGEN-RICH ACTIVE REGION-CHANNEL INTERFACE

[75] Inventors: Charles E. May; Robert Dawson; Michael Duane, all of Austin, Tex.

[73] Assignee: Advanced Micro Devices, Inc., Sunnyvale, Calif.

[21] Appl. No.: 08/994,182

[22] Filed: Dec. 19, 1997

[51] Int. Cl.[7] ................................................ H01L 21/336
[52] U.S. Cl. ...................... 438/302; 438/306; 438/232; 438/516; 438/525; 438/528
[58] Field of Search ..................................... 438/302, 306, 438/525, 516, 528, 232, FOR 158, FOR 168, FOR 169, FOR 216–FOR 218

[56] References Cited

U.S. PATENT DOCUMENTS

| | | |
|---|---|---|
| 4,682,407 | 7/1987 | Wilson et al. . |
| 4,714,519 | 12/1987 | Pfiester . |
| 4,745,079 | 5/1988 | Pfiester . |
| 5,360,751 | 11/1994 | Lee . |
| 5,438,007 | 8/1995 | Vinal et al. . |
| 5,514,902 | 5/1996 | Kawasaki et al. ........................ 257/607 |
| 5,516,707 | 5/1996 | Loh et al. .................................... 437/24 |
| 5,554,781 | 9/1996 | Yamashita et al. ....................... 257/336 |
| 5,750,435 | 5/1998 | Pan ............................................ 438/525 |
| 5,804,496 | 9/1998 | Duane ....................................... 438/520 |
| 5,837,585 | 11/1998 | Wu et al. .................................. 438/264 |

OTHER PUBLICATIONS

U.S. application No. 08/780,615, filed Jan. 8, 1997.

*Primary Examiner*—Wael Fahmy
*Assistant Examiner*—Long Pham

[57] ABSTRACT

A semiconductor device having a nitrogen-rich active region-channel interface and process for fabrication thereof is provided. The nitrogen-rich interface can, for example, can reduce the electric field potential in this region and reduce hot carrier injection effects. Consistent with one embodiment of the invention, a semiconductor device is provided having a substrate, at least one gate electrode disposed over the substrate and an active region disposed adjacent to gate electrode. The semiconductor device further includes a channel region extending from the active region beneath the gate electrode and a nitrogen-rich region disposed at an interface between the channel region and the active region. The nitrogen-rich region may, for example, be disposed at least in part in the channel region. The nitrogen-rich region may, for example, also be disposed at least part of the active region. Further, the active region may be disposed, for example, within the nitrogen-rich region.

18 Claims, 4 Drawing Sheets

METHOD FOR MAKING SEMICONDUCTOR DEVICE HAVING NITROGEN-RICH ACTIVE REGION-CHANNEL INTERFACE

FIELD OF THE INVENTION

The present invention is directed generally to semiconductor devices and more particularly to a semiconductor device having a nitrogen-rich active region-channel interface and process for fabrication thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

Figure 1:
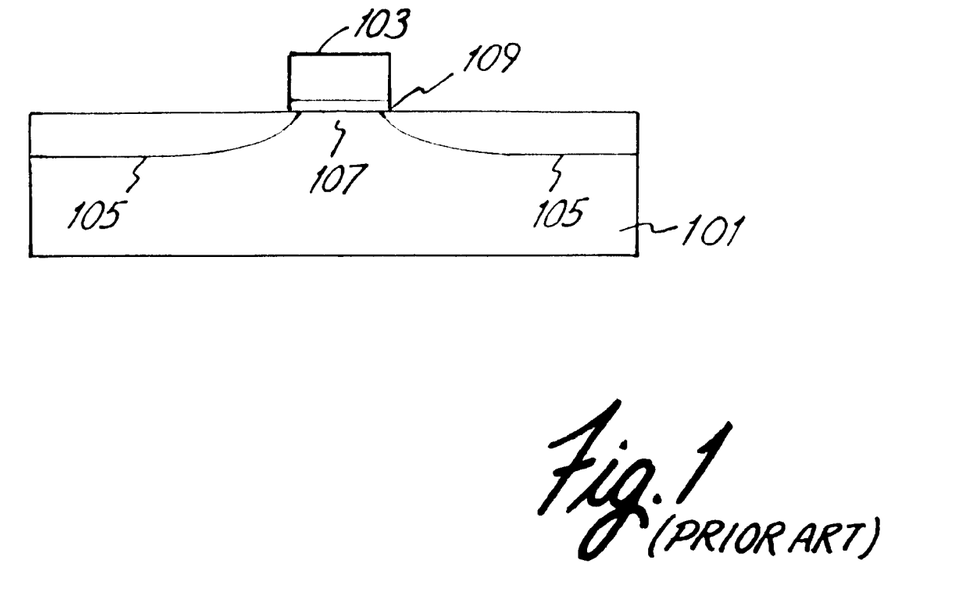
FIG. 1 illustrates one typical MOS device.

The principal elements of a typical MOS semiconductor device are illustrated in FIG. 1. The device generally includes a semiconductor substrate 101 on which a gate electrode 103 is disposed. The gate electrode 103 is typically a heavily doped conductor having uniform conductivity. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain. A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral as well as vertical dimensions of the device structure.

As device geometries are scaled down, fabrication of the device becomes more complicated. For example, as transistors are scaled, the transverse electric field generated in a MOS device typically increases. If the transverse electric field becomes sufficiently strong, it can give rise to hot carrier effects which can significantly degrade device performance. The problems associated with hot carrier effects are particular pronounced in short channel devices (having, for example, submicron channel lengths) and serve to limit scaling down of semiconductor devices.

One important hot carrier effect is hot-carrier injection of electrons into the gate oxide and/or gate electrode. Hot carrier injection generally causes a deleterious gate current (when the electrons pass into the gate electrode) and an undesirable increase in the threshold voltage of the device (when the electrons are trapped in the gate oxide). Another important hot carrier effect is forward injection of electrons from the source to the drain. Forward injection of electrons generally causes a deleterious source-to-drain current (often referred to as a leakage current).

SUMMARY OF THE INVENTION

Generally, the present invention relates to a semiconductor device having a nitrogen-rich active region-channel interface and process for fabrication thereof. The nitrogen-rich interface can, for example, can reduce the electric field potential in this region and reduce hot carrier injection effects.

Consistent with one embodiment of the invention, a semiconductor device is provided having a substrate, at least one gate electrode disposed over the substrate and an active region disposed adjacent to gate electrode. The semiconductor device further includes a channel region extending from the active region beneath the gate electrode and a nitrogen-rich region disposed at an interface between the channel region and the active region. The nitrogen-rich region may, for example, be disposed at least in part in the channel region. The nitrogen-rich region may, for example, also be disposed at least part of the active region. Further, the active region may be disposed, for example, within the nitrogen-rich region.

In accordance with another embodiment, a semiconductive fabrication process is provided which includes forming at least one gate electrode over a surface of a substrate, forming a nitrogen-rich region under part of the gate electrode, and forming an active region adjacent gate electrode and under part of the gate electrode, wherein the nitrogen-rich region extends further under the gate electrode than the active region. The nitrogen-rich region may, for example, be formed by implanting a nitrogen-bearing species, such as $N_2$ or $^{14}N$, into the substrate.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS structures such as NMOS, PMOS, CMOS and BiC-MOS transistors, for example. While the present invention is not so limited, an appreciation of various aspects of the invention will be gained through a discussion of the fabrication process and characteristics of such a device in connection with the examples provided below.

Figure 2A:
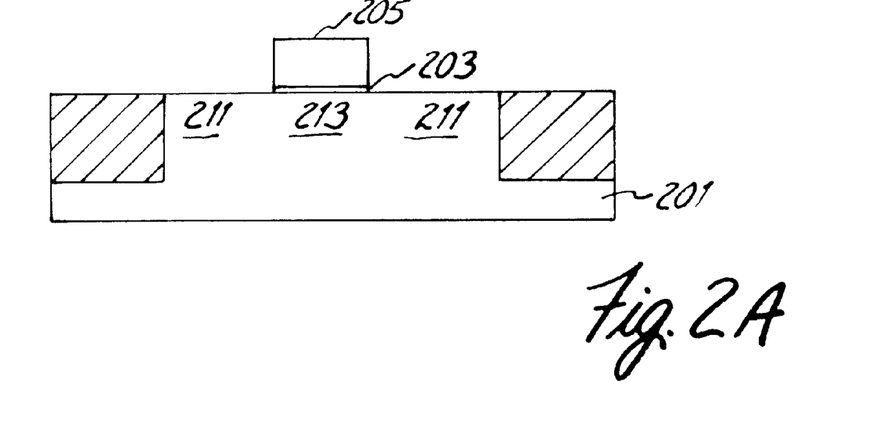
FIGS. 2A–2C illustrate an example fabrication process in accordance with one embodiment of the invention.
Figure 2B:
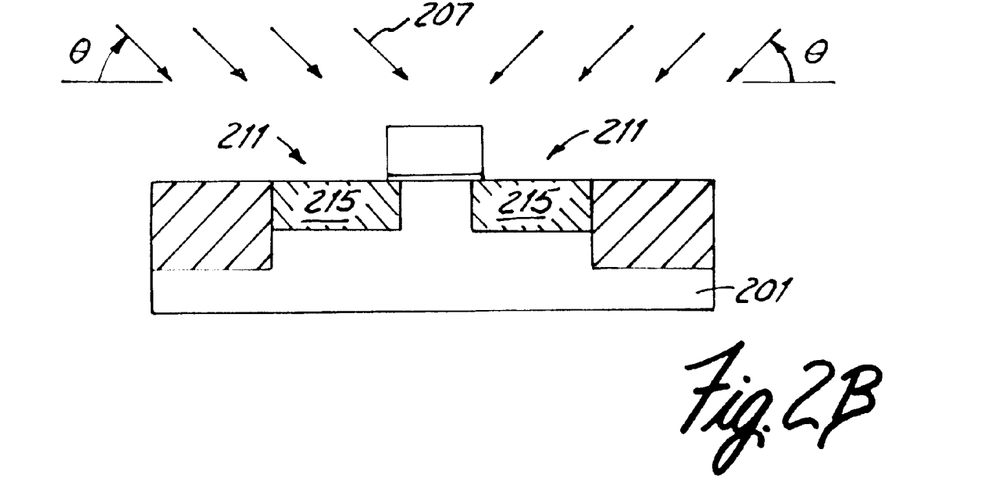
Figure 2C:
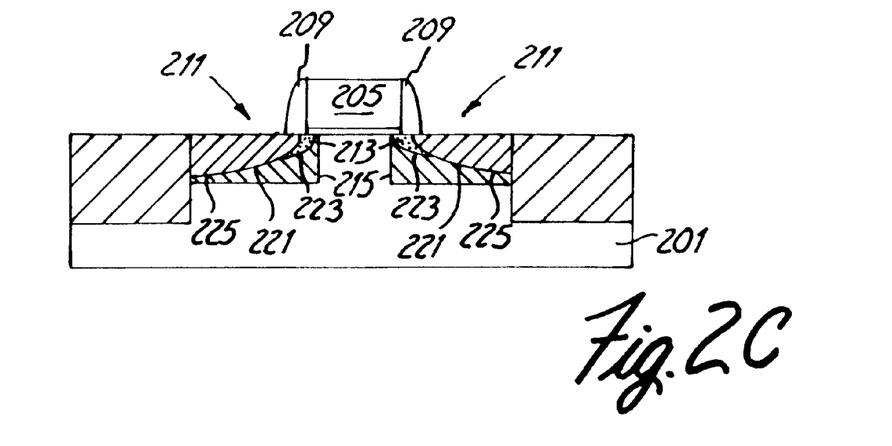

FIGS. 2A–2C illustrate a process for fabricating a semiconductor device having a nitrogen-rich active region-channel interface. Using known techniques, a gate insulating layer 203, typically an oxide layer, is formed on a substrate 201. Gate electrodes 205 (only one of which is shown) are then formed on the gate insulating layer 203. The resultant structure is illustrated in FIG. 2A. It will be appreciated that a number of different known fabrication techniques could be used to obtain the gate electrode structure depicted in FIG. 2A.

Portions of the semiconductor substrate 201 which lie adjacent the gate electrode 205 generally define active regions 211 of the substrate 201. As used herein, the term active region encompasses a region where an active portion of the semiconductor device has been or will be formed. The active regions 211 may serve, for example, as source/drain regions of a semiconductor device. The portion of the semiconductor substrate 201 which lies beneath the gate electrode 205 general defines a channel region 213 of the substrate 201. The channel region 213 will general extend between the source/drain regions. It should be appreciated that in the formation of the source/drain regions, dopant used to form the source/drain regions may laterally diffuse beneath the gate electrode 205 thus shortening the effective length of the channel region 213.

Nitrogen-rich regions 215 are formed in the substrate 201 under edge portions of the gate electrode 203 and typically, in the active regions 211. The resultant structure is illustrated in FIG. 2B. The nitrogen-rich regions 215 may be formed by doping the substrate 201 with a nitrogen bearing species 207, such as $N_2$ or $^{14}N$, which will distribute the electric potential at the active region-channel region interface. As will be discussed below, active regions 211 are typically heavily doped with an n-type or p-type dopant to form conductive source/drain regions. The incorporation of nitrogen at the interface of the source/drain regions and the channel region varies the electric field potential at the interface by inhibiting the mobility of the source/drain dopant around this interface.

In the illustrated embodiment, the nitrogen-bearing species 207 is implanted into the substrate 201. The nitrogen-bearing species may be implanted into the substrate 201 at an angle θ with respect to the surface of the substrate 201 as exemplified by the arrows of FIG. 2B. This may be accomplished in a single implantation process by rotating the substrate 201 or in a multi-step implantation process if desired. Though the illustrative embodiment utilizes implantation, it should be appreciated that other doping processes, such as diffusion, fall within the scope of the invention.

The characteristics (e.g., dosage, implant angle, and energy level) of the nitrogen implant are typically selected to provide sufficient penetration of nitrogen beneath the gate electrode 203 so that the nitrogen-rich regions 215 are formed at the interfaces between the channel region 211 and future source/drain regions. Typically, the nitrogen-rich regions 215 will extend ahead of the source/drain regions and lie in part of the channel region 213. The implant characteristics are also selected to provide sufficient distribution of the electric field at the active region-channel interface to reduce hot carrier effects. Typically, the energy level is selected to implant the nitrogen as deep as or deeper than a subsequent source/drain implant. Suitable implant energies and dosages for an $N_2$ impurity range from about 10 to 60 KeV and 5E13 to 2E15 atoms/cm$^2$, respectively, for many applications.

The angle θ typically has a magnitude sufficient to allow the nitrogen to penetrate beneath the gate electrode 203. The magnitude of angle θ is also typically sufficient to allow implantation of the nitrogen beneath successive gate electrodes on the substrate. The angle θ lies between 0° and 90°, more typically between 30° and 45°, and is about 30° in the illustrated embodiment. While the implant characteristics may vary depending on the application, what is important is that the particular nitrogen implant angle, energy level, and dosage is selected to provide a sufficient concentration of nitrogen at the active region-channel interface to distribute the electric field at the interface and reduce hot carrier effects.

Source/drain regions 221 are formed in the active regions 211 adjacent the gate electrode 205. The resultant structure is illustrated in FIG. 2C. The source/drain regions 221 may, for example, be LDD (lightly-doped drain) source/drain regions. To form an LDD source/drain region 221, the active region 211 is lightly doped, for example, by implantation, using the gate electrode 205 to align the implantation. In this manner an LDD region 223 is formed in the substrate 201. The type of dopant implanted typically depends on the type of device being formed. In PMOS devices, the dopant is typically a p-type dopant such as boron. In NMOS devices, an n-type dopant such as arsenic or phosphorus is typically used. Suitable implant energies and dosages for the LDD dopant range from 5 to 60 KeV and 5E13 to 1E15 atoms/cm$^2$ respectively for many applications.

Using conventional techniques, spacers 209 are formed on sidewalls of the gate electrode 205, as shown in FIG. 2C. Using the spacers 209 for alignment, a dopant is implanted into the active regions 211 of the substrate to form heavily-doped region 225, of the LDD source/drain region 221, in the substrate 201. This dopant is of the same type as the LDD dopant above. Suitable implant energies and dosages for this implant range from 5 to 60 KeV and 1E15 ($1\times10^{15}$) to 7E15 ($7\times10^{15}$) atoms/cm$^2$ for many applications. Doping of the gate electrode 205 typically occurs during the source/drain implants. It should be appreciated however that this gate and source/drain implant can be performed in separate steps and/or with different dopants.

Following the source/drain implants, the substrate is typically annealed to activate the dopants within the LDD source/drain regions 221. The anneal also serves to diffuse the LDD source/drain 221 dopant laterally and vertically within the substrate 201. In particular, the LDD dopant typically diffuses under the gate electrode 205 to shorten the effective length of the channel. However, the implanted nitrogen serves to inhibit this diffusion and provides a less sharp p/n junction at the channel— source/drain region interface. This increases the distribution of the electric field at this interface and improves the transistors resistance to hot carrier effects. The beneficial effects of a nitrogen-rich interface region are especially apparent in PMOS devices using highly mobile dopants such as boron.

The above process can be used to form semiconductor device having an impurity (e.g., nitrogen) rich active region-channel region interface, basic components of which are depicted in the structure of FIG. 2C. In particular, the structure includes a gate electrode 205, source/drain regions 221 adjacent to and extending partially under the gate electrode 205, a channel region 213 extending between the source/drain regions 221 beneath the gate electrode 203, and nitrogen-rich regions 215 at the interfaces between the source/drain regions 221 and the channel region 213. In the example embodiment, the source/drain regions 221 are formed within the nitrogen rich regions 215 and at least part of each nitrogen-rich region 215 is disposed in the channel region 213. The formation of the nitrogen-rich region 215 within the channel region 213 can result from the initial nitrogen implant, subsequent diffusion of the implanted nitrogen (e.g., during source/drain anneal), and/or push-ahead of the implanted nitrogen from the LDD and S/D implants.

Using the above process, a nitrogen-rich active region-channel region interface can be formed. The incorporation of nitrogen at this interface can, for example, distribute the electric field potential at the active region-channel interface and increase device performance by, for example, reducing hot-carrier injection effects.

As illustrated in FIG. 2B, the nitrogen may also be implanted into edge portions of the gate electrode 205. This can serve to reduce overlap capacitance and further increase device performance. A more detailed description of the effects of an impurity implant into a gate electrode can be found in U.S. patent application Ser. No. 08/780,615, filed Jan. 8, 1997, entitled "Semiconductor Device Having Reduced Overlap Capacitance And Method Of Manufacture Thereof", now U.S. Pat. No. 5,804,496, the contents of which are herein incorporated by reference.

It is noted that the above described process is not limited to the formation of LDD devices, but may be used to form a number of different semiconductor devices. For example, the LDD implant illustrated in FIG. 2B may be omitted with the source/drain region being formed solely by the heavy dose implant. Moreover, while the above process is generally illustrated with respect to a single MOS (e.g., NMOS or PMOS) device, the present invention is not so limited. The invention extends to cover transistors formed on other devices, such as CMOS and BiCMOS devices. While not exhaustive, exemplary processes for forming CMOS (or BiCMOS) devices are discussed below.

Figure 3A:
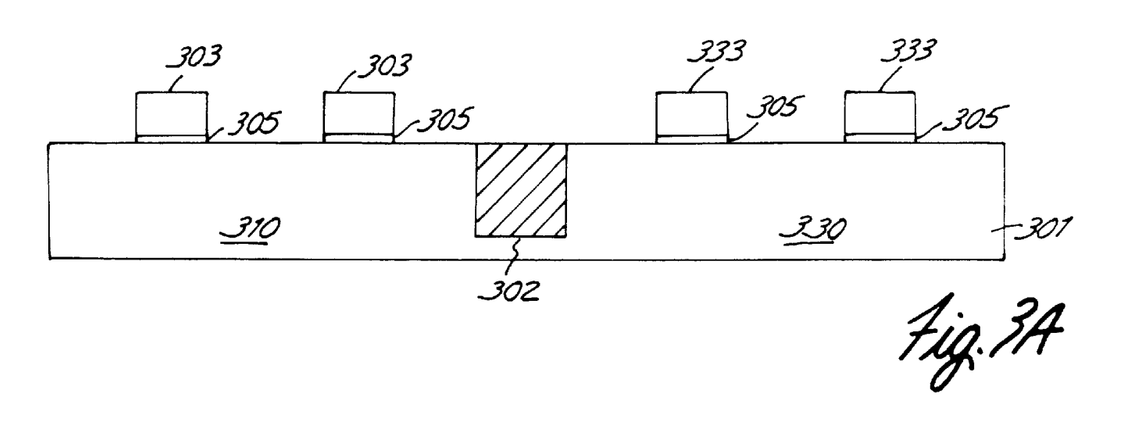
FIGS. 3A–3D illustrate an example fabrication process in accordance with another embodiment of the invention.

FIGS. 3A–3D illustrate an exemplary process of fabricating a CMOS device having nitrogen-rich active region-channel interfaces. Using known techniques, NMOS device regions and PMOS device regions are defined and gate electrodes are formed on a substrate 301 (only two gate electrodes for each type of region is shown). As should be appreciated, the NMOS device region 310 and PMOS device region 330 are typically separated by a field region 302. The gate electrodes 303 in the NMOS device region 310 and the gate electrodes 333 in the PMOS device region 330 are each typically insulated from the substrate 301 by a gate dielectric 305. The resultant structure is illustrated in FIG. 3A. It will be appreciated that a number of different known fabrication techniques could be used to obtain the gate electrode structures depicted in FIG. 3A.

The term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is associated with n-type doped active regions and gate electrode.

Figure 3B:
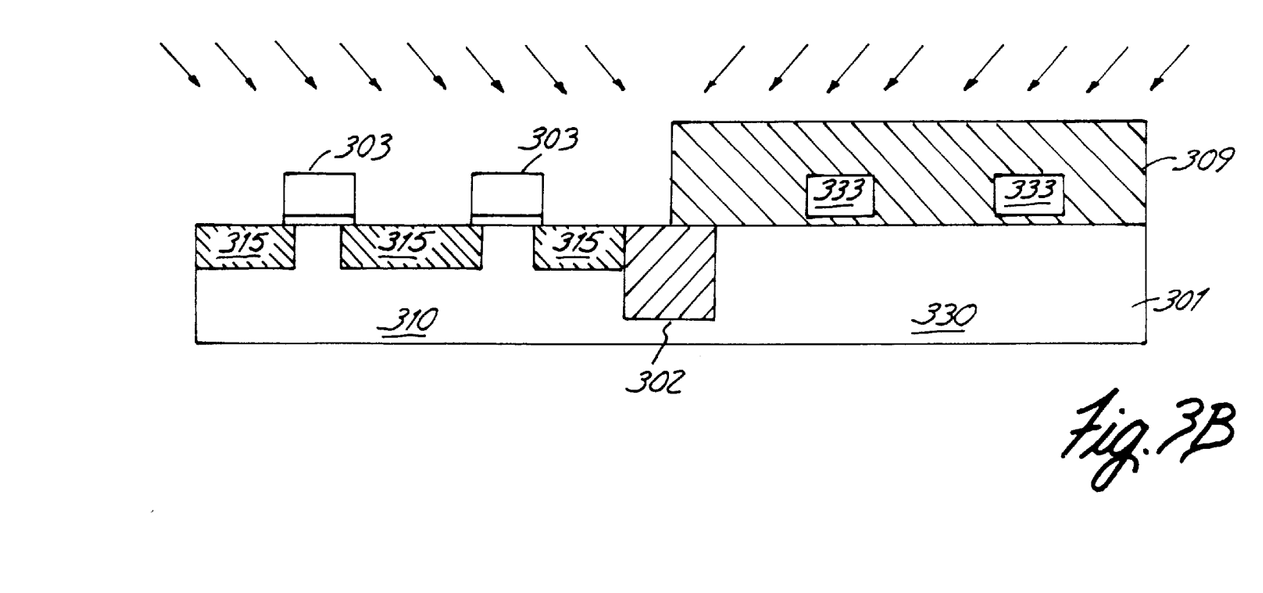

Following formation of the gate electrodes 303 and 333, a mask 309 is formed to expose the NMOS device region 310 and typically cover the PMOS device region 330 of the substrate 301, as shown in FIG. 3B. This may, for example, be performed by developing and selectively removing a photoresist. Nitrogen-rich regions 315 are then formed in portions of the substrate 301 adjacent gate electrodes 303. The nitrogen-rich regions 315 may be formed in a similar manner as discussed above (e.g., by implanting a nitrogen-bearing species).

Figure 3C:
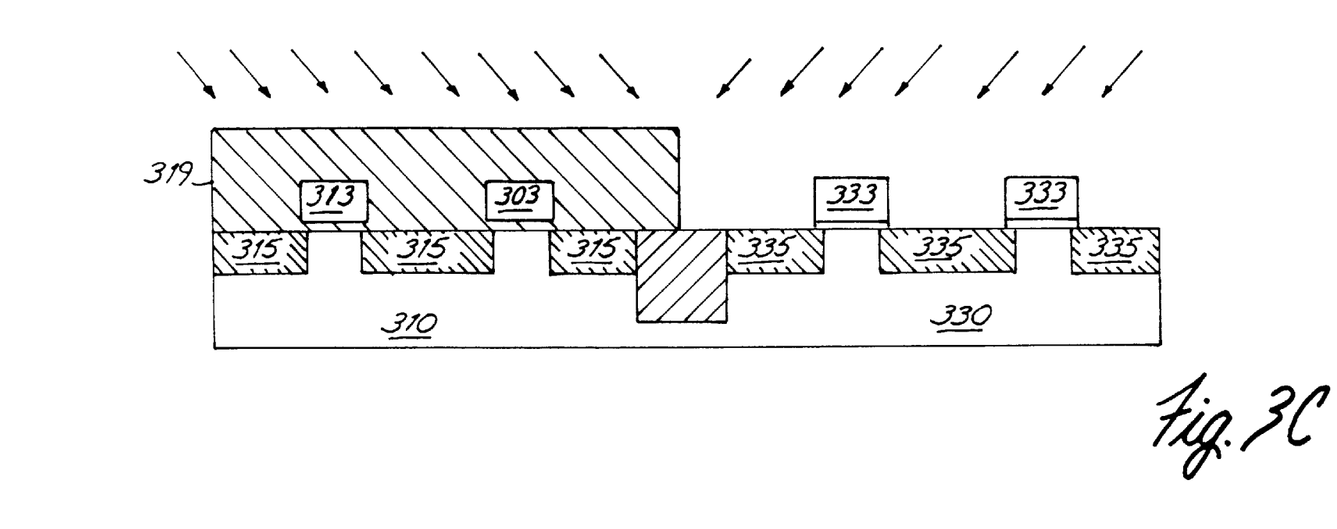

The mask 309 is removed and a mask 319 is formed to expose the PMOS device region 330 and typically cover the NMOS device region 310 of the substrate 301, as indicated in FIG. 3C. This may, for example, be performed by selectively removing a photoresist. Nitrogen-rich regions 335 are then formed through a substrate 301 under edge portions of the gate electrodes 333 and typically in the active region adjacent the gate electrodes 333. The nitrogen-rich regions 335 may be formed in a similar manner as discussed above (e.g., by implanting a nitrogen-bearing species).

The implant dosages used to form the nitrogen-rich regions 335 and the nitrogen-rich regions 315 are typically selected to optimize device performance. For example, where the source/drain regions in PMOS device region 330 are formed from a more mobile dopant than the dopant used to form NMOS source/drain regions, a higher dosage of nitrogen may be implanted onto the substrate to form the nitrogen-rich regions 335 as compared to nitrogen-rich regions 315. In this case, the higher dosage of nitrogen in the PMOS device region 330 optimizes device performance by providing a higher concentration of nitrogen at the active region-channel interfaces of the PMOS device 330 which are subject to increased hot carrier effects due to the higher mobility of p-type dopants, such as boron, as compared to n-type dopants, such as arsenic or phosphorus. For example, in the PMOS device region 330, a nitrogen bearing species may be implanted at dosages of 5E14 to 2E15 atoms/cm$^2$ and in the NMOS device region 310, a nitrogen bearing species may be implanted at 5E13 to 7E14 atoms/cm$^2$.

Figure 3D:
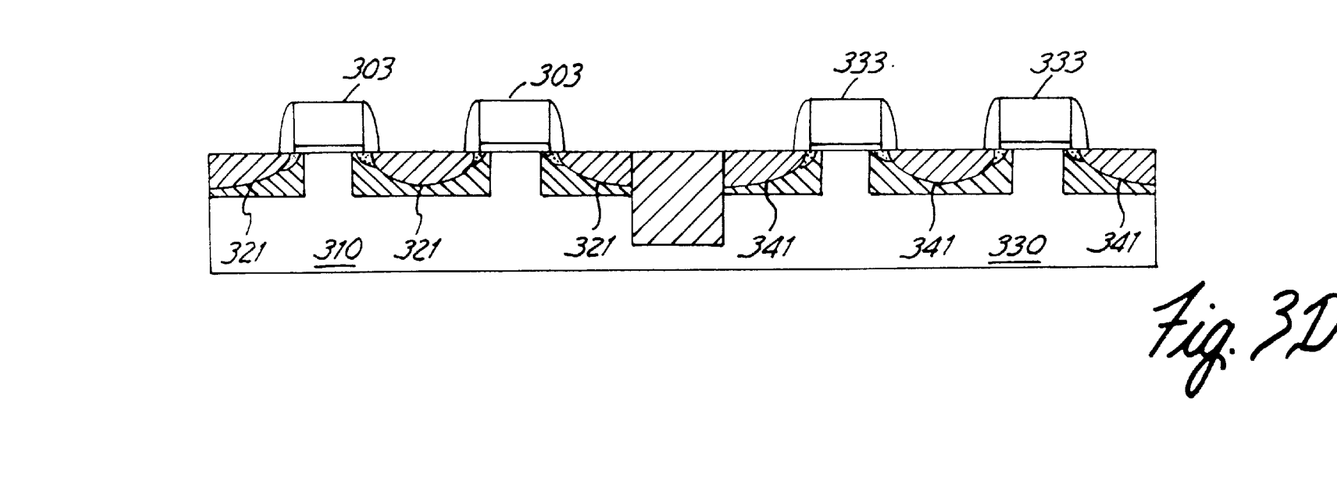

The mask 319 may be removed and the fabrication process may continue with source/drain formation. NMOS source/drain regions 321 are formed adjacent gate electrodes 303. PMOS source/drain regions 341 are formed adjacent the gate electrodes 333. This may be done using, for example, well-known techniques. The illustrated source/drain regions 321 and 341 are LDD source/drain regions by way of example and not of limitations. Moreover, while the illustrated source/drain regions 321, 341 are formed after the nitrogen implants, the invention is not so limited. In other embodiments the formation of the source/drain regions 321, 341 may be integrated with the formation of the nitrogen-rich regions. For example, NMOS source/drain regions may be formed with mask 309 in place and PMOS source/drain regions may be formed with the mask 319 in place.

Using the above process, asymmetrically doped nitrogen-rich regions may be formed at the active region-channel interfaces in NMOS and PMOS devices. In particular, the process allows for one type (e.g., the PMOS device) to be provided with a higher concentration of nitrogen at the channel-active region interfaces. This, for example, allows for optimization of device performance by selective implanting of nitrogen to form nitrogen-rich regions at active region-channel region interfaces.

It should be appreciated that the CMOS process illustrated in FIGS. 3A–3D is provided by way of example only. A number of different manners exist whereby PMOS and NMOS device regions may be doped with nitrogen at the active region-channel interfaces. For example, an NMOS implant of nitrogen may be omitted and the NMOS device region masked while nitrogen is implanted into the PMOS region, if desired. As another example, a blanket implant of nitrogen may be performed to form nitrogen-rich regions in the NMOS and PMOS device regions and the NMOS device region may be masked and a supplemental nitrogen implant into the PMOS device regions performed in order to more heavily dope the nitrogen-rich regions of the PMOS device region. While these example generally illustrate a higher concentration of nitrogen in the PMOS device regions, it should be appreciated that this relationship may be reversed and the NMOS device regions may be provided with a higher concentration nitrogen-rich regions if desired, for example, to optimize device performance. Of course, in any CMOS process, the PMOS and NMOS device regions may receive the same nitrogen implant to form similar nitrogen-rich regions in each device region.

It is also noted that spacers may be formed adjacent a gate electrode prior to implanting a nitrogen bearing species into the substrate to space the nitrogen implant from the gate electrode. In CMOS devices, the spacers may be formed on gate electrodes of one or both of the PMOS and NMOS device regions.

As noted above, the present invention is applicable to the fabrication of a number of different devices in which a nitrogen-rich active region-channel interface and/or the advantages obtained therefrom are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a CMOS device having at least one PMOS device region and at least one NMOS device region, comprising:

forming at least one PMOS electrode in the PMOS device region and at least one NMOS gate electrode in the NMOS device region;

forming a PMOS nitrogen-rich region under an edge portion of the PMOS gate electrode and an NMOS nitrogen-rich region under an edge portion of the NMOS gate electrode;

forming a PMOS active region adjacent the PMOS gate electrode, the PMOS nitrogen-rich region extending further under the edge portion of the PMOS gate electrode than the PMOS active region; and forming an NMOS active region adjacent the NMOS gate electrode, the NMOS nitrogen-rich region extending further under the edge portion of the NMOS gate electrode than the NMOS active region.

2. The process of claim 1, wherein forming the NMOS and PMOS nitrogen-rich regions includes performing a blanket implant of a nitrogen-bearing species into the NMOS and PMOS device regions.

3. The process of claim 2, further including selectively masking one of the NMOS device regions and PMOS device regions and implanting a nitrogen-bearing species into the unmasked region to increase a concentration of nitrogen in the unmasked region relative to the masked region.

4. The process of claim 1, wherein forming the NMOS and PMOS nitrogen-rich regions includes selectively masking the PMOS device region and implanting a nitrogen-bearing species into the NMOS device region and selectively masking the PMOS device region and implanting a nitrogen-bearing species into the PMOS device region.

5. The process of claim 1, wherein forming the NMOS and PMOS nitrogen-rich regions includes implanting one or more nitrogen-bearing species at an angle with respect to the substrate.

6. The process of claim 1, wherein the PMOS nitrogen-rich region has a higher concentration of nitrogen than the NMOS nitrogen-rich region.

7. The process of claim 1, wherein the PMOS nitrogen-rich region has the same concentration of nitrogen as the NMOS nitrogen-rich region.

8. The process of claim 1, wherein the NMOS nitrogen-rich region has a higher concentration of nitrogen than the PMOS nitrogen-rich region.

9. A method of forming a semiconductor device, comprising:

forming at least one gate electrode over a substrate;

implanting a nitrogen bearing species into a substrate region adjacent the gate electrode at a non-orthogonal angle relative to the substrate to form a nitrogen-rich region in the substrate region and under an edge portion of the gate electrode; and implanting a dopant into the substrate region adjacent the gate electrode to a depth no deeper than a depth of the nitrogen bearing species implant to form an active region adjacent the gate electrode and under the edge portion of the gate electrode, the nitrogen-rich region extending further under the edge portion of the gate electrode than the active region.

10. The method of claim 9, wherein the implanted dopant is an n-type dopant.

11. The method of claim 9, wherein the implanted dopant is a p-type dopant.

12. The method of claim 9, wherein the dopant is implanted after the nitrogen bearing species.

13. The method of claim 9, wherein the non-orthogonal angle is between 30 and 45 degrees.

14. The method of claim 9 wherein implanting the nitrogen bearing species includes implanting the nitrogen bearing species without masking the gate electrode.

15. The method of claim 9, wherein the nitrogen bearing species is implanted at a dose ranging from about 5E13 atoms/$cm^2$ to about 2E15 atoms/$cm^2$.

16. The method of claim 15, wherein the nitrogen bearing species is implanted at an energy level ranging from about 10 KeV to about 60 KeV.

17. The method of claim 9, wherein implanting dopant to form the active region includes implanting a first dopant to form an LDD region and implanting a second dopant to form a source/drain region, the active region being an LDD source/drain region.

18. A method of forming a semiconductor device, comprising:

forming at least one gate electrode over a substrate;

implanting a nitrogen bearing species into a substrate region adjacent the gate electrode to form a nitrogen-rich region in the substrate region and under an edge portion of the gate electrode; and implanting a dopant into the substrate region adjacent the gate electrode to form an active region adjacent the gate electrode and under the edge portion of the gate electrode, the nitrogen-rich region extending further under the edge portion of the gate electrode than the active region, wherein the nitrogen bearing species implant is performed at a non-orthogonal angle relative to the substrate and to a sufficient depth such that the nitrogen-rich region surrounds the active region.

\* \* \* \* \*

UNITED STATES PATENT AND TRADEMARK OFFICE
CERTIFICATE OF CORRECTION

PATENT NO.    : 6,030,875
DATED         : February 29, 2000
INVENTOR(S)   : May et al.

It is certified that error appears in the above-identified patent and that said Letters Patent is hereby corrected as shown below:

Column 3,
Line 41, "general" should read -- generally --.
Line 42, "general" should read -- generally --.

Column 5,
Line 65, "is" should read -- are --.

Column 7,
Line 26, "example" should read -- examples --.

Signed and Sealed this

Twenty-fifth Day of June, 2002

Attest:

Attesting Officer

JAMES E. ROGAN
Director of the United States Patent and Trademark Office